United States Patent
Lee et al.

(10) Patent No.: US 7,824,743 B2
(45) Date of Patent: Nov. 2, 2010

(54) DEPOSITION PROCESSES FOR TITANIUM NITRIDE BARRIER AND ALUMINUM

(75) Inventors: Wei Ti Lee, San Jose, CA (US);
Yen-Chih Wang, Hsinchu (TW); Mohd Fadzli Anwar Hassan, Sunnyvale, CA (US); Ryeun Kwan Kim, Ichon-shi (KR); Hyung Chul Park, San Jose, CA (US); Ted Guo, Palo Alto, CA (US); Alan A. Ritchie, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 495 days.

(21) Appl. No.: 11/864,100

(22) Filed: Sep. 28, 2007

(65) Prior Publication Data
US 2009/0087585 A1    Apr. 2, 2009

(51) Int. Cl.
*B05D 5/12* (2006.01)
*H01L 21/04* (2006.01)
*H01L 21/203* (2006.01)
*H05H 1/24* (2006.01)

(52) U.S. Cl. .................. 427/576; 427/97.1; 427/126.3; 438/640; 438/656; 438/685; 257/751; 257/763

(58) Field of Classification Search .................. 427/576; 204/192.1
See application file for complete search history.

(56) References Cited

U.S. PATENT DOCUMENTS

| | | | |
|---|---|---|---|
| 4,389,973 A | 6/1983 | Suntola et al. | |
| 4,413,022 A | 11/1983 | Suntola et al. | |
| 5,834,372 A | 11/1998 | Lee et al. | |
| 5,916,365 A | 6/1999 | Sherman | |
| 5,923,056 A | 7/1999 | Lee et al. | |
| 5,976,327 A * | 11/1999 | Tanaka ................... 204/192.15 |
| 6,015,917 A | 1/2000 | Bhandari et al. | |

(Continued)

FOREIGN PATENT DOCUMENTS

EP    1167569    1/2002

(Continued)

OTHER PUBLICATIONS

Baukal et al., Computational Fluid Dynamics in Industrial Combustion, CRC Press, (2000), pp. 463.*

(Continued)

*Primary Examiner*—Michael Cleveland
*Assistant Examiner*—Lisha Jiang
(74) *Attorney, Agent, or Firm*—Patterson & Sheridan, LLP

(57) ABSTRACT

Embodiments described herein provide a method for forming two titanium nitride materials by different PVD processes, such that a metallic titanium nitride layer is initially formed by a PVD process in a metallic mode and a titanium nitride retarding layer is formed over a portion of the metallic titanium nitride layer by a PVD process in a poison mode. Subsequently, a first aluminum layer, such as an aluminum seed layer, may be selectively deposited on exposed portions of the metallic titanium nitride layer by a CVD process. Thereafter, a second aluminum layer, such as an aluminum bulk layer, may be deposited on exposed portions of the first aluminum layer and the titanium nitride retarding layer during an aluminum PVD process.

38 Claims, 4 Drawing Sheets

U.S. PATENT DOCUMENTS

| | | | |
|---|---|---|---|
| 6,084,302 A | 7/2000 | Sandhu | |
| 6,124,158 A | 9/2000 | Dautartas et al. | |
| 6,144,060 A | 11/2000 | Park et al. | |
| 6,174,809 B1 | 1/2001 | Kang et al. | |
| 6,197,683 B1 | 3/2001 | Kang et al. | |
| 6,200,893 B1 | 3/2001 | Sneh | |
| 6,203,613 B1 | 3/2001 | Gates et al. | |
| 6,207,487 B1 | 3/2001 | Kim et al. | |
| 6,270,572 B1 | 8/2001 | Kim et al. | |
| 6,284,646 B1 | 9/2001 | Leem et al. | |
| 6,287,965 B1 | 9/2001 | Kang et al. | |
| 6,294,836 B1 | 9/2001 | Paranjpe et al. | |
| 6,305,314 B1 | 10/2001 | Sneh et al. | |
| 6,342,277 B1 | 1/2002 | Sherman | |
| 6,348,376 B2 | 2/2002 | Lim et al. | |
| 6,358,829 B2 | 3/2002 | Yoon et al. | |
| 6,365,502 B1 | 4/2002 | Paranjpe et al. | |
| 6,372,598 B2 | 4/2002 | Kang et al. | |
| 6,379,748 B1 | 4/2002 | Bhandari et al. | |
| 6,391,785 B1 | 5/2002 | Satta et al. | |
| 6,399,491 B2 | 6/2002 | Jeon et al. | |
| 6,410,986 B1 * | 6/2002 | Merchant et al. | 257/763 |
| 6,416,577 B1 | 7/2002 | Suntoloa et al. | |
| 6,416,822 B1 | 7/2002 | Chiang et al. | |
| 6,428,859 B1 | 8/2002 | Chiang et al. | |
| 6,444,263 B1 | 9/2002 | Paranjpe et al. | |
| 6,451,119 B2 | 9/2002 | Sneh et al. | |
| 6,451,695 B2 | 9/2002 | Sneh | |
| 6,468,924 B2 | 10/2002 | Lee et al. | |
| 6,475,276 B1 | 11/2002 | Elers et al. | |
| 6,475,910 B1 | 11/2002 | Sneh | |
| 6,482,262 B1 | 11/2002 | Elers et al. | |
| 6,482,733 B2 | 11/2002 | Raaijmakers et al. | |
| 6,498,091 B1 | 12/2002 | Chen et al. | |
| 6,511,539 B1 | 1/2003 | Raaijmakers et al. | |
| 6,524,952 B1 | 2/2003 | Srinivas et al. | |
| 6,562,715 B1 * | 5/2003 | Chen et al. | 438/643 |
| 6,569,501 B2 | 5/2003 | Chiang et al. | |
| 6,585,823 B1 | 7/2003 | Van Wijck et al. | |
| 6,593,484 B2 | 7/2003 | Yasuhara et al. | |
| 6,596,602 B2 | 7/2003 | Iizuka et al. | |
| 6,599,572 B2 | 7/2003 | Saanila et al. | |
| 6,607,976 B2 | 8/2003 | Chen et al. | |
| 6,620,723 B1 | 9/2003 | Byun et al. | |
| 6,627,995 B2 | 9/2003 | Paranjpe et al. | |
| 6,630,201 B2 | 10/2003 | Chiang et al. | |
| 6,632,279 B1 | 10/2003 | Ritala et al. | |
| 6,645,847 B2 | 11/2003 | Paranjpe et al. | |
| 6,660,622 B2 | 12/2003 | Chen et al. | |
| 6,718,126 B2 | 4/2004 | Lei | |
| 6,740,585 B2 | 5/2004 | Yoon et al. | |
| 6,772,072 B2 | 8/2004 | Ganguli et al. | |
| 6,773,507 B2 | 8/2004 | Jallepally et al. | |
| 6,777,352 B2 | 8/2004 | Tepman et al. | |
| 6,784,096 B2 | 8/2004 | Chen et al. | |
| 6,790,773 B1 | 9/2004 | Drewery et al. | |
| 6,800,173 B2 | 10/2004 | Chiang et al. | |
| 6,803,272 B1 | 10/2004 | Halliyal et al. | |
| 6,812,126 B1 | 11/2004 | Paranjpe et al. | |
| 6,815,285 B2 | 11/2004 | Choi et al. | |
| 6,821,563 B2 | 11/2004 | Yudovsky | |
| 6,831,004 B2 | 12/2004 | Byun et al. | |
| 6,838,125 B2 | 1/2005 | Chung et al. | |
| 6,846,516 B2 | 1/2005 | Yang et al. | |
| 6,861,356 B2 | 3/2005 | Matsuse et al. | |
| 6,875,271 B2 | 4/2005 | Glenn et al. | |
| 6,893,915 B2 | 5/2005 | Park et al. | |
| 6,905,541 B2 | 6/2005 | Chen et al. | |
| 6,905,737 B2 | 6/2005 | Verplancken et al. | |
| 6,915,592 B2 | 7/2005 | Guenther | |
| 6,916,398 B2 | 7/2005 | Chen et al. | |
| 6,936,906 B2 | 8/2005 | Chung et al. | |
| 6,939,801 B2 | 9/2005 | Chung et al. | |
| 6,951,804 B2 | 10/2005 | Seutter et al. | |
| 6,953,742 B2 | 10/2005 | Chen et al. | |
| 6,955,211 B2 | 10/2005 | Ku et al. | |
| 6,972,267 B2 | 12/2005 | Cao et al. | |
| 6,974,771 B2 | 12/2005 | Chen et al. | |
| 6,998,014 B2 | 2/2006 | Chen et al. | |
| 7,005,697 B2 | 2/2006 | Batra et al. | |
| 7,026,238 B2 | 4/2006 | Xi et al. | |
| 7,041,335 B2 | 5/2006 | Chung | |
| 7,049,226 B2 | 5/2006 | Chung et al. | |
| 7,067,422 B2 | 6/2006 | Nakamura et al. | |
| 7,081,271 B2 | 7/2006 | Chung et al. | |
| 7,081,409 B2 | 7/2006 | Kang et al. | |
| 7,094,680 B2 | 8/2006 | Seutter et al. | |
| 7,098,131 B2 | 8/2006 | Kang et al. | |
| 7,186,385 B2 | 3/2007 | Ganguli et al. | |
| 7,204,886 B2 | 4/2007 | Chen et al. | |
| 7,208,413 B2 | 4/2007 | Byun et al. | |
| 7,211,508 B2 | 5/2007 | Chung et al. | |
| 7,408,225 B2 | 8/2008 | Shinriki et al. | |
| 2001/0000866 A1 | 5/2001 | Sneh et al. | |
| 2001/0002280 A1 | 5/2001 | Sneh | |
| 2001/0009695 A1 | 7/2001 | Saanila et al. | |
| 2001/0024387 A1 | 9/2001 | Raaijmakers et al. | |
| 2001/0025979 A1 | 10/2001 | Kim et al. | |
| 2001/0028924 A1 | 10/2001 | Sherman | |
| 2001/0034123 A1 | 10/2001 | Jeon et al. | |
| 2001/0041250 A1 | 11/2001 | Werkhoven et al. | |
| 2001/0054730 A1 | 12/2001 | Kim et al. | |
| 2001/0054769 A1 | 12/2001 | Raaijmakers et al. | |
| 2002/0000598 A1 | 1/2002 | Kang et al. | |
| 2002/0007790 A1 | 1/2002 | Park | |
| 2002/0009544 A1 | 1/2002 | McFeely et al. | |
| 2002/0020869 A1 | 2/2002 | Park et al. | |
| 2002/0021544 A1 | 2/2002 | Cho et al. | |
| 2002/0031618 A1 | 3/2002 | Sherman | |
| 2002/0048635 A1 | 4/2002 | Kim et al. | |
| 2002/0052097 A1 | 5/2002 | Park | |
| 2002/0060363 A1 | 5/2002 | Xi et al. | |
| 2002/0068458 A1 | 6/2002 | Chiang et al. | |
| 2002/0073924 A1 | 6/2002 | Chiang et al. | |
| 2002/0076481 A1 | 6/2002 | Chiang et al. | |
| 2002/0076507 A1 | 6/2002 | Chiang et al. | |
| 2002/0076508 A1 | 6/2002 | Chiang et al. | |
| 2002/0076837 A1 | 6/2002 | Hujanen et al. | |
| 2002/0086111 A1 | 7/2002 | Byun et al. | |
| 2002/0086507 A1 | 7/2002 | Park et al. | |
| 2002/0094689 A1 | 7/2002 | Park | |
| 2002/0098627 A1 | 7/2002 | Pomarede et al. | |
| 2002/0104481 A1 | 8/2002 | Chiang et al. | |
| 2002/0106536 A1 | 8/2002 | Lee et al. | |
| 2002/0106846 A1 | 8/2002 | Seutter et al. | |
| 2002/0115886 A1 | 8/2002 | Yasuhara et al. | |
| 2002/0117399 A1 | 8/2002 | Chen et al. | |
| 2002/0144655 A1 | 10/2002 | Chiang et al. | |
| 2002/0144657 A1 | 10/2002 | Chiang et al. | |
| 2002/0146511 A1 | 10/2002 | Chiang et al. | |
| 2002/0155722 A1 | 10/2002 | Satta et al. | |
| 2002/0162506 A1 | 11/2002 | Sneh et al. | |
| 2002/0164421 A1 | 11/2002 | Chiang et al. | |
| 2002/0164423 A1 | 11/2002 | Chiang et al. | |
| 2002/0177282 A1 | 11/2002 | Song | |
| 2002/0182320 A1 | 12/2002 | Leskela et al. | |
| 2002/0187256 A1 | 12/2002 | Elers et al. | |
| 2002/0197402 A1 | 12/2002 | Chiang et al. | |
| 2002/0197856 A1 | 12/2002 | Matsuse et al. | |
| 2003/0013320 A1 | 1/2003 | Kim et al. | |
| 2003/0017697 A1 | 1/2003 | Choi et al. | |
| 2003/0022487 A1 | 1/2003 | Yoon et al. | |
| 2003/0029715 A1 | 2/2003 | Yu et al. | |
| 2003/0031807 A1 | 2/2003 | Elers et al. | |

| | | | | | | |
|---|---|---|---|---|---|---|
| 2003/0038369 A1 | 2/2003 | Layadi et al. | | 2005/0164487 A1 | 7/2005 | Seutter et al. |
| 2003/0042630 A1 | 3/2003 | Babcoke et al. | | 2005/0173068 A1 | 8/2005 | Chen et al. |
| 2003/0049931 A1 | 3/2003 | Byun et al. | | 2005/0189072 A1 | 9/2005 | Chen et al. |
| 2003/0049942 A1 | 3/2003 | Haukka et al. | | 2005/0208217 A1 | 9/2005 | Shinriki et al. |
| 2003/0053799 A1 | 3/2003 | Lei | | 2005/0220998 A1 | 10/2005 | Chang et al. |
| 2003/0057526 A1 | 3/2003 | Chung et al. | | 2005/0252449 A1 | 11/2005 | Nguyen et al. |
| 2003/0057527 A1 | 3/2003 | Chung et al. | | 2005/0255690 A1 | 11/2005 | Chen et al. |
| 2003/0059538 A1 | 3/2003 | Chung et al. | | 2005/0257735 A1 | 11/2005 | Guenther |
| 2003/0072975 A1 | 4/2003 | Shero et al. | | 2005/0260357 A1 | 11/2005 | Olsen et al. |
| 2003/0079686 A1 | 5/2003 | Chen et al. | | 2005/0263890 A1 * | 12/2005 | Han et al. .................... 257/751 |
| 2003/0082296 A1 | 5/2003 | Elers et al. | | 2005/0266682 A1 | 12/2005 | Chen et al. |
| 2003/0082301 A1 | 5/2003 | Chen et al. | | 2005/0271812 A1 | 12/2005 | Myo et al. |
| 2003/0082307 A1 | 5/2003 | Chung et al. | | 2005/0271813 A1 | 12/2005 | Kher et al. |
| 2003/0087520 A1 | 5/2003 | Chen et al. | | 2006/0019033 A1 | 1/2006 | Muthukrishnan et al. |
| 2003/0089308 A1 | 5/2003 | Raaijmakers | | 2006/0019494 A1 | 1/2006 | Cao et al. |
| 2003/0101927 A1 | 6/2003 | Raaijmakers | | 2006/0019495 A1 | 1/2006 | Marcadal et al. |
| 2003/0106490 A1 | 6/2003 | Jallepally et al. | | 2006/0030148 A1 | 2/2006 | Seutter et al. |
| 2003/0108674 A1 | 6/2003 | Chung et al. | | 2006/0035025 A1 | 2/2006 | Verplancken et al. |
| 2003/0113187 A1 | 6/2003 | Lei et al. | | 2006/0057843 A1 | 3/2006 | Chen et al. |
| 2003/0116087 A1 | 6/2003 | Nguyen et al. | | 2006/0062917 A1 | 3/2006 | Muthukrishnan et al. |
| 2003/0121608 A1 | 7/2003 | Chen et al. | | 2006/0075966 A1 | 4/2006 | Chen et al. |
| 2003/0124262 A1 | 7/2003 | Chen et al. | | 2006/0128150 A1 | 6/2006 | Gandikota et al. |
| 2003/0143328 A1 | 7/2003 | Chen et al. | | 2006/0148253 A1 | 7/2006 | Chung et al. |
| 2003/0153177 A1 | 8/2003 | Tepman et al. | | 2006/0153973 A1 | 7/2006 | Chang et al. |
| 2003/0168750 A1 | 9/2003 | Basceri et al. | | 2006/0153995 A1 | 7/2006 | Narwankar et al. |
| 2003/0173586 A1 | 9/2003 | Moriwaki et al. | | 2006/0156979 A1 | 7/2006 | Thakur et al. |
| 2003/0186495 A1 | 10/2003 | Saanila et al. | | 2006/0199372 A1 | 9/2006 | Chung et al. |
| 2003/0190423 A1 | 10/2003 | Yang et al. | | 2006/0216928 A1 | 9/2006 | Chung et al. |
| 2003/0190804 A1 | 10/2003 | Glenn et al. | | 2006/0257295 A1 | 11/2006 | Chen et al. |
| 2003/0205729 A1 | 11/2003 | Basceri et al. | | 2006/0276020 A1 | 12/2006 | Yoon et al. |
| 2003/0213987 A1 | 11/2003 | Basceri et al. | | 2007/0003698 A1 | 1/2007 | Chen et al. |
| 2003/0219942 A1 | 11/2003 | Choi et al. | | 2007/0018244 A1 | 1/2007 | Hung et al. |
| 2003/0224578 A1 | 12/2003 | Chung et al. | | 2007/0020890 A1 | 1/2007 | Thakur et al. |
| 2003/0224600 A1 | 12/2003 | Cao et al. | | 2007/0026147 A1 | 2/2007 | Chen et al. |
| 2003/0232497 A1 | 12/2003 | Xi et al. | | 2007/0067609 A1 | 3/2007 | Chen et al. |
| 2004/0005749 A1 | 1/2004 | Choi et al. | | 2007/0099415 A1 | 5/2007 | Chen et al. |
| 2004/0009307 A1 | 1/2004 | Koh et al. | | 2007/0119370 A1 | 5/2007 | Ma et al. |
| 2004/0011504 A1 | 1/2004 | Ku et al. | | 2007/0119371 A1 | 5/2007 | Ma et al. |
| 2004/0013577 A1 | 1/2004 | Ganguli et al. | | 2007/0128862 A1 | 6/2007 | Ma et al. |
| 2004/0014320 A1 | 1/2004 | Chen et al. | | 2007/0128863 A1 | 6/2007 | Ma et al. |
| 2004/0015300 A1 | 1/2004 | Ganguli et al. | | 2007/0128864 A1 | 6/2007 | Ma et al. |
| 2004/0018304 A1 | 1/2004 | Chung et al. | | | | |
| 2004/0018723 A1 | 1/2004 | Byun et al. | | \multicolumn{3}{c}{FOREIGN PATENT DOCUMENTS} | | |
| 2004/0018747 A1 | 1/2004 | Lee et al. | | | | |
| 2004/0025370 A1 | 2/2004 | Guenther | | GB | 2355727 | 5/2001 |
| 2004/0033698 A1 | 2/2004 | Lee et al. | | JP | 07300649 | 11/1995 |
| 2004/0046197 A1 | 3/2004 | Basceri et al. | | JP | 2001111000 | 4/2001 |
| 2004/0048461 A1 | 3/2004 | Chen et al. | | JP | 2001172767 | 6/2001 |
| 2004/0065255 A1 | 4/2004 | Yang et al. | | WO | WO-9929924 | 6/1999 |
| 2004/0067641 A1 | 4/2004 | Yudovsky | | WO | WO-9965064 | 12/1999 |
| 2004/0071897 A1 | 4/2004 | Verplancken et al. | | WO | WO-0016377 | 3/2000 |
| 2004/0077183 A1 | 4/2004 | Chung | | WO | WO-0054320 | 9/2000 |
| 2004/0105934 A1 | 6/2004 | Chang et al. | | WO | WO-0115220 | 3/2001 |
| 2004/0144311 A1 | 7/2004 | Chen et al. | | WO | WO-0117692 | 3/2001 |
| 2004/0170403 A1 | 9/2004 | Lei | | WO | WO-0127346 | 4/2001 |
| 2004/0187304 A1 | 9/2004 | Chen et al. | | WO | WO-0127347 | 4/2001 |
| 2004/0209460 A1 | 10/2004 | Xi et al. | | WO | WO-0129280 | 4/2001 |
| 2004/0211665 A1 | 10/2004 | Yoon et al. | | WO | WO-0129891 | 4/2001 |
| 2004/0219784 A1 | 11/2004 | Kang et al. | | WO | WO-0129893 | 4/2001 |
| 2004/0224506 A1 | 11/2004 | Choi et al. | | WO | WO-0136702 | 5/2001 |
| 2004/0235285 A1 | 11/2004 | Kang et al. | | WO | WO-0166832 | 9/2001 |
| 2004/0241321 A1 | 12/2004 | Ganguli et al. | | WO | WO-0201628 | 1/2002 |
| 2004/0256351 A1 | 12/2004 | Chung et al. | | WO | WO-0208485 | 1/2002 |
| 2004/0266175 A1 | 12/2004 | Chen et al. | | WO | WO-0243115 | 5/2002 |
| 2005/0006799 A1 | 1/2005 | Gregg et al. | | WO | WO-0245167 | 6/2002 |
| 2005/0008779 A1 | 1/2005 | Yang et al. | | WO | WO-0245871 | 6/2002 |
| 2005/0009325 A1 | 1/2005 | Chung et al. | | WO | WO-0246489 | 6/2002 |
| 2005/0059240 A1 | 3/2005 | Choi et al. | | WO | WO-2004106584 | 12/2004 |
| 2005/0074968 A1 | 4/2005 | Chen et al. | | | | |
| 2005/0104142 A1 | 5/2005 | Narayanan et al. | | \multicolumn{3}{c}{OTHER PUBLICATIONS} | | |
| 2005/0106865 A1 | 5/2005 | Chung et al. | | | | |
| 2005/0118804 A1 | 6/2005 | Byun et al. | | \multicolumn{3}{l}{Nakayama et al., Use of a Titanium Nitride for Electrochemical} | | |
| 2005/0139948 A1 | 6/2005 | Chung et al. | | \multicolumn{3}{l}{Inactivation of Marine Bacteria, Environmental Science and Technology, (1998), pp. 798-801.*} | | |

Wang et al., Handbook of Nanophase and Nanostructured Materials, Springer, (2002), pp. 250.*

"Ta(N$_t$C$_5$H$_{11}$)[N(CH$_3$)$_2$] Taimata ®," <http://c1005059.securesites.net/topic/Taimata/Taimata-E.htm>, Jun. 13, 2007, pp. 1-3.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

Goswami, et al. Transition Metals Show Promise as Copper Barriers, Semiconductor International, ATMI, San Jose—May 1, 2004.

Hong, et al. "Characteristics of PAALD-TaN thin films derived from TAIMATA precursor for copper metallization", Internconnect Technology Conference, 2004. Proceedings of the IEEE 2004 International, Jun. 7-9, 2004, pp. 9-11.

Kukli, et al. "Atomic Layer Epitaxy Growth of Tantalum Oxide Thin Films from Ta(OC$_2$H$_5$)$_5$ and H$_2$O," Journal of the Electrochemical Society, vol. 142, No. 5, May 1995; p. 1670-5.

Kukli, et al. "In situ Study of Atomic Layer Epitaxy Growth of Tantalum Oxide Thin Films From Ta(OC$_2$H$_5$)$_5$ and H$_2$O," Applied Surface Science, vol. 112, Mar. 1997, p. 236-42.

Kukli, et al. "Properties of {Nb$_{1-x}$Ta$_x$}$_2$O$_5$ Solid Solutions and {Nb$_{1-x}$Ta$_x$}$_2$O$_5$-ZrO$_2$ Nanolaminates Grown by Atomic Layer Epitaxy," 1997; p. 785-93.

Kukli, et al. "Properties of Ta$_2$O$_5$-Based Dielectric Nanolaminates Deposited by Atomic Layer Epitaxy," Journal of the Electrochemical Society, vol. 144, No. 1, Jan. 1997; p. 300-6.

Kukli, et al. "Tailoring the Dielectric Properties of HfO$_2$-Ta$_2$-O$_5$ Nanolaminates," Applied Physics Letters, vol. 68, No. 26, Jun. 24, 1996; p. 3737-9.

Niinisto, et al. "Synthesis of Oxide Thin Films and Overlayers by Atomic Layer Epitaxy for Advanced Applications," Materials Science and Engineering B41 (1996) pp. 23-29.

Park, et al. "Performance improvement of MOSFET with HfO$_2$Al$_2$O$_3$ laminate gate dielectric and CVD-TaN metal gate deposited by TAIMATA", Electron Devices Meeting, 2003. IEDM '03 Techinical Digest. IEEE International Dec. 8-10, 2003, pp. 13.6.1-13.6.4.

Ritala, et al. "Perfectly Conformal TiN and Al$_2$O$_3$ Films Deposited by Atomic Layer Deposition," Chemical Vapor Deposition, Jan. 1999, 5, No. 1, pp. 6-9.

Rossnagel, et al. "Plasma-enhanced Atomic Layer Deposition of Ta and Ti for Interconnect Diffusion Barriers," J. Vac. Sci. Technol. B., vol. 18, No. 4 (Jul. 2000); pp. 2016-2020.

Shenai, et al. "Correlation of vapor pressure equation and film properties with trimethylindium purity for the MOVPE grown III-V compounds," Journal of Crystal Growth 248 (2003) pp. 91-98.

* cited by examiner

DEPOSITION PROCESSES FOR TITANIUM NITRIDE BARRIER AND ALUMINUM

BACKGROUND OF THE INVENTION

1. Field of the Invention

Embodiments of the invention generally relate to the formation of metal nitride barrier layers and conductive metal layers deposited thereon, and more particularly, to titanium nitride barrier layers and aluminum layers deposited thereon.

2. Description of the Related Art

In the manufacture of integrated circuits, barrier layers are often used to inhibit the diffusion of metals and other impurities into regions underlying such barrier layers. These underlying regions may include transistor gates, capacitor dielectric, semiconductor substrates, metal lines, as well as many other structures that appear in integrated circuits. For the current submicron generation of semiconductor devices, any microscopic reaction at an interface between interconnection layers can cause degradation of the resulting integrated circuits (e.g., increase the resistivity of the interconnection layers). Consequently, barrier layers have become a critical component for improving the reliability of interconnect metallization schemes.

Compounds of refractory metals such as, for example, nitrides, borides, silicides, and carbides have been suggested as diffusion barriers because of their chemical inertness and low resistivities (e.g., resistivities typically less than about 500 $\mu\Omega$-cm). In particular, refractory metal nitrides, such as, for example, titanium nitride have been suggested for use as a barrier material since layers formed thereof generally have low resistivities and are chemically stable at high temperatures.

Refractory metal nitride barrier layers may be formed using chemical vapor deposition (CVD), atomic layer deposition (ALD), or physical vapor deposition (PVD) processes. During a CVD or ALD process, a titanium precursor may be reacted with a nitrogen precursor (e.g., $TiCl_4$ and $NH_3$) to form titanium nitride layer. However, CVD or ALD processes may require high deposition temperatures (e.g., >600° C.) to form a typical titanium nitride layer, which may affect other material layers that are in contact with the metal nitride barrier layers. For example, metal nitride barrier layers are often deposited onto buried semiconductor junctions. At high temperatures dopants in the semiconductor junctions may diffuse out of the buried junctions, potentially changing the characteristics thereof.

Additionally, when chlorine-based chemistries are used to form the metal nitride barrier layers during a CVD or ALD process, such nitride layers typically contain chlorine contaminants therein. A high chlorine concentration is undesirable because chlorine may migrate from the metal nitride barrier layer into adjacent material layers (e.g., interconnection layers) which can increase the contact resistance of such layers, potentially changing the characteristics of integrated circuits made therefrom. Alternatively, organometallic precursors (e.g., tetrakis(dialkylamido) titanium compounds) may be used during a CVD or ALD process. However, the metal nitride barrier layers formed from an organometallic precursor often contain high levels of carbon, which increases the resistivity of the material.

Other problems that occur while manufacturing electronic devices is due to the need for smaller structures, especially for apertures and vias, which are approaching widths of 0.12 $\mu$m and smaller. These high aspect ratio structures have complicated surfaces to deposit barrier layers on, and also small vias that need to be filled with conductive materials, such as aluminum. The reliability of an aluminum plug is lost if gaps are formed within the vias while being filled with aluminum.

Therefore, a need exists for reliable metal nitride barrier layers used in integrated circuit fabrication, particularly desirable is titanium nitride barrier layers. Also, a need exist for a process to fill high aspect ratio structures with conductive materials, preferably, aluminum.

SUMMARY OF THE INVENTION

Embodiments described herein provide a method for forming two titanium nitride materials by different PVD processes, such that a metallic titanium nitride layer is initially formed and a titanium nitride retarding layer is formed over a portion of the metallic titanium nitride layer. The metallic titanium nitride layer is deposited by a PVD process conducted in metallic mode, while the titanium nitride retarding layer is deposited by a PVD process conducted in poison mode by increasing the nitrogen gas flow and decreasing the DC power applied to the titanium target relative to the metallic mode. Subsequently, an aluminum seed layer may be selectively deposited on exposed portions of the metallic titanium nitride layer by a CVD process. Thereafter, an aluminum bulk layer may be deposited on exposed portions of the aluminum seed layer and the titanium nitride retarding layer during an aluminum PVD process.

In one embodiment, a method for forming a conductive material on a substrate is provided which includes positioning the substrate within a process chamber, wherein the substrate contains a dielectric material disposed thereon, the dielectric material has an upper surface and apertures formed therein, and each aperture has a lower surface and sidewalls, and depositing a metallic titanium nitride layer on the upper surface of the dielectric material and on the lower surfaces and the sidewalls of the apertures during a first PVD process. A first plasma may be generated with nitrogen gas having a flow rate of less than about 80 sccm during the first PVD process. The method further includes depositing a titanium nitride retarding layer on the metallic titanium nitride layer during a second PVD process, wherein a second plasma is generated with the nitrogen gas having a flow rate of greater than about 80 sccm during the second PVD process. In many examples, the titanium nitride retarding layer deposited on the lower surfaces and sidewalls of the apertures is about 10% or less of the thickness as the titanium nitride retarding layer deposited across the field of the substrate.

Embodiments provides that the first PVD process and the second PVD process may be performed in different process chambers, but preferably, are performed in the same process chamber. In some example, the flow rate of the nitrogen gas is less than about 70 sccm during the first PVD process, preferably, about 55 sccm or less. A RF bias is usually engaged during the first PVD process, but not during the second PVD process. Also, the plasma generator is usually set at a lower power level while forming the titanium nitride retarding layer during the second PVD process than while forming the metallic titanium nitride layer during the first PVD process. For example, a RF bias may be applied to the substrate during the first PVD process and the RF bias may be removed from the substrate during the second PVD process. The RF bias may have a power level within a range from about 100 W to about 800 W during the first PVD process. Also, a DC power may be applied to a titanium target at a first power level within a range from about 20 kW to about 40 kW, preferably, from about 25 kW to about 35 kW during the first PVD process. However, during the second PVD process, a second DC power may be applied to the titanium target at a second power level within a range from about 1 kW to about 30 kW, preferably, from about 5 kW to about 25 kW.

Embodiments provide that the metallic titanium nitride layer may contain a metallic titanium nitride material having the chemical formula of $Ti_xN_y$, where x is within a range from about 1.5 to about 2 and y is about 1. Also, the titanium nitride retarding layer may contain a titanium nitride retarding material having the chemical formula of $Ti_xN_y$, where x is about 1 and y is within a range from about 1 to about 1.2. The metallic titanium nitride layer may have a thickness within a range from about 100 Å to about 1,000 Å, preferably, from about 200 Å to about 500 Å, for example, about 300 Å. The titanium nitride retarding layer may have a thickness within a range from about 2 Å to about 100 Å, preferably, from about 10 Å to about 50 Å, for example, about 30 Å.

Embodiments of the invention further provide depositing a first aluminum layer selectively on exposed portions of the metallic titanium nitride layer while maintaining the titanium nitride retarding layer substantially free of the first aluminum layer during a CVD process, and depositing a second aluminum layer on the titanium nitride retarding layer and on the exposed portions of the first aluminum layer during an aluminum PVD process. In some examples, the apertures are vias which are completely filled by depositing the second aluminum layer.

In another embodiment, a method for forming a conductive material on a substrate is provided which includes positioning the substrate within a process chamber, depositing a metallic titanium nitride layer on the upper surface of the dielectric material and on the lower surfaces and the sidewalls of the apertures during a first PVD process, wherein the metallic titanium nitride layer contains a metallic titanium nitride material having the chemical formula of $Ti_xN_y$, where x is within a range from about 1.5 to about 2 and y is about 1. The method further provides depositing a titanium nitride retarding layer on the metallic titanium nitride layer deposited on the upper surface of the dielectric material during a second PVD process, wherein the titanium nitride retarding layer contains a second titanium nitride material having the chemical formula of $Ti_xN_y$, where x is about 1 and y is within a range from about 1 to about 1.2. In some examples, the titanium nitride retarding layer deposited on the lower surfaces and sidewalls of the apertures may be about 10% or less of the thickness as the titanium nitride retarding layer deposited across the field of the substrate.

The metallic titanium nitride layer may be deposited by applying a RF bias to the substrate during the first PVD process while applying a first DC power to a titanium target at a first power level within a range from about 20 kW to about 40 kW, preferably, from about 25 kW to about 35 kW. The RF bias may have a power level within a range from about 100 W to about 800 W during the first PVD process. Also, the titanium nitride retarding layer may be deposited by removing the RF bias from the substrate during the second PVD process and applying a second DC power to the titanium target at a second power level within a range from about 1 kW to about 30 kW, preferably, from about 5 kW to about 25 kW.

In another embodiment, a method for forming a conductive material on a substrate is provided which includes positioning a substrate within a PVD chamber, depositing a metallic titanium nitride layer on the upper surface of the dielectric material and on the lower surfaces and the sidewalls of the apertures during a first PVD process within the PVD chamber, and depositing a titanium nitride retarding layer on the metallic titanium nitride layer deposited on the upper surface of the dielectric material during a second PVD process within the same PVD chamber. In one example, the first PVD process may include flowing nitrogen gas into the PVD chamber at a flow rate of less than about 80 sccm, applying a RF bias to the substrate, while applying a first DC power to a titanium target at a power level within a range from about 20 kW to about 40 kW to ignite a plasma. Further, the second PVD process may include flowing the nitrogen gas into the PVD chamber at a flow rate of about 80 sccm or greater, removing the RF bias from the substrate, while applying a second DC power to a titanium target at a power level within a range from about 5 kW to about 25 kW to ignite a second plasma.

In another embodiment, a method for forming a conductive material on a substrate is provided which includes positioning the substrate within a process chamber, depositing a metallic titanium nitride layer on the upper surface of the dielectric material and on the lower surfaces and the sidewalls of the apertures during a first PVD process, and depositing a titanium nitride retarding layer on the metallic titanium nitride layer deposited over the upper surface of the dielectric material while maintaining the lower surface of the apertures substantially free of the titanium nitride retarding layer during a second PVD process. The method further provides selectively depositing a first aluminum layer selectively on exposed portions of the metallic titanium nitride layer during a CVD process while maintaining the titanium nitride retarding layer free of the first aluminum layer, and depositing a second aluminum layer on the titanium nitride retarding layer and on the exposed portions of the first aluminum layer during the aluminum PVD process. In one example, the titanium nitride retarding layer deposited on the lower surfaces and sidewalls of the apertures is about 10% or less of the thickness as the titanium nitride retarding layer deposited across the field of the substrate.

In some examples, a first plasma is generated with nitrogen gas having a flow rate of less than about 80 sccm during the first PVD process, and a second plasma is generated with the nitrogen gas having a flow rate of greater than about 80 sccm during the second PVD process. In one example of first PVD process, the flow rate of the nitrogen gas may be less than about 70 sccm, preferably, about 55 sccm or less, such as about 50 sccm.

In other examples, the first aluminum layer may have a thickness within a range from about 400 Å to about 600 Å and the second aluminum layer may have a thickness within a range from about 5,000 Å to about 6,000 Å. In one example, the first aluminum layer and the second aluminum layer have a combined thickness within a range from about 1,000 Å to about 10,000 Å. In another example the substrate may be heated to a temperature within a range from about 50° C. to about 250° C. during the CVD process while depositing the first aluminum layer. During the CVD processes, the substrate may be exposed to an aluminum precursor, which includes alane compounds, aluminum borohydride compounds, alkyl aluminum compounds, alkyl aluminum hydride compounds, complexes thereof, derivates thereof, or combinations thereof. In specific examples, the aluminum precursor may be methylpyrrolidine:alane, aluminum borohydride trimethylamine, dimethyl aluminum hydride, complexes thereof, or derivates thereof.

In another embodiment, a method for forming a conductive material on a substrate is provided which includes positioning the substrate within a PVD chamber, depositing a metallic titanium nitride layer on the upper surface of the dielectric material and on the lower surfaces and the sidewalls of the apertures during a PVD process, transferring the substrate into a CVD chamber, and depositing an aluminum layer on the metallic titanium nitride layer during a CVD process. The deposited metallic titanium nitride material may have the chemical formula of $Ti_xN_y$, where x is within a range from about 1.5 to about 2 and y is about 1. The method provides that the PVD process includes flowing nitrogen gas into the PVD chamber at a flow rate of less than about 80 sccm, applying a RF bias to the substrate, while applying a first DC power to a titanium target at a first power level within a range from about 20 kW to about 40 kW to ignite a plasma. In some examples, the PVD process further provides that the flow rate of the nitrogen is about 55 sccm or less, and the first power level is within a range from about 25 kW to about 35 kW.

In other embodiments, the method provides depositing a titanium nitride retarding layer on the metallic titanium nitride layer deposited over the upper surface of the dielectric material while maintaining the lower surface of the apertures substantially free of the titanium nitride retarding layer during a second PVD process. In some examples, the titanium nitride retarding layer may be maintained substantially free of the aluminum layer while selectively depositing the aluminum layer on exposed portions of the metallic titanium nitride layer during the CVD process. The method provides that the second PVD process includes flowing the nitrogen gas into the PVD chamber at a flow rate of about 80 sccm or greater, removing the RF bias from the substrate, while applying a second DC power to a titanium target at a power level within a range from about 5 kW to about 25 kW to ignite a second plasma.

In some examples, the substrate may be heated to a temperature within a range from about 50° C. to about 250° C. during the CVD process while depositing the aluminum layer. The substrate may be exposed to an aluminum precursor during the CVD process while depositing the aluminum layer, such that the aluminum precursor may be include alane compounds, aluminum borohydride compounds, alkyl aluminum compounds, alkyl aluminum hydride compounds, complexes thereof, or derivates thereof. In some examples, the aluminum precursor may contain methylpyrrolidine:alane, aluminum borohydride trimethylamine, dimethyl aluminum hydride, complexes thereof, or derivates thereof. In other examples, the aluminum layer may have a thickness within a range from about 400 Å to about 600 Å. In an alternative embodiment, the method provides depositing another aluminum layer on the substrate during another PVD process.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments described herein provide a method for forming two titanium nitride materials by different PVD processes, such that a metallic titanium nitride layer is initially formed on a substrate and a titanium nitride retarding layer is formed over at least a portion of the metallic titanium nitride layer. The titanium nitride retarding layer is primarily deposited across the field of the substrate and minimally deposited, if at all, within any exposed apertures contained on the substrate. Subsequently, an aluminum seed layer may be selectively deposited on exposed portions of the metallic titanium nitride layer by a CVD process, preferably, a MOCVD process. Thereafter, an aluminum bulk layer may be deposited on exposed portions of the aluminum seed layer and the titanium nitride retarding layer during an aluminum PVD process.

Figure 1:
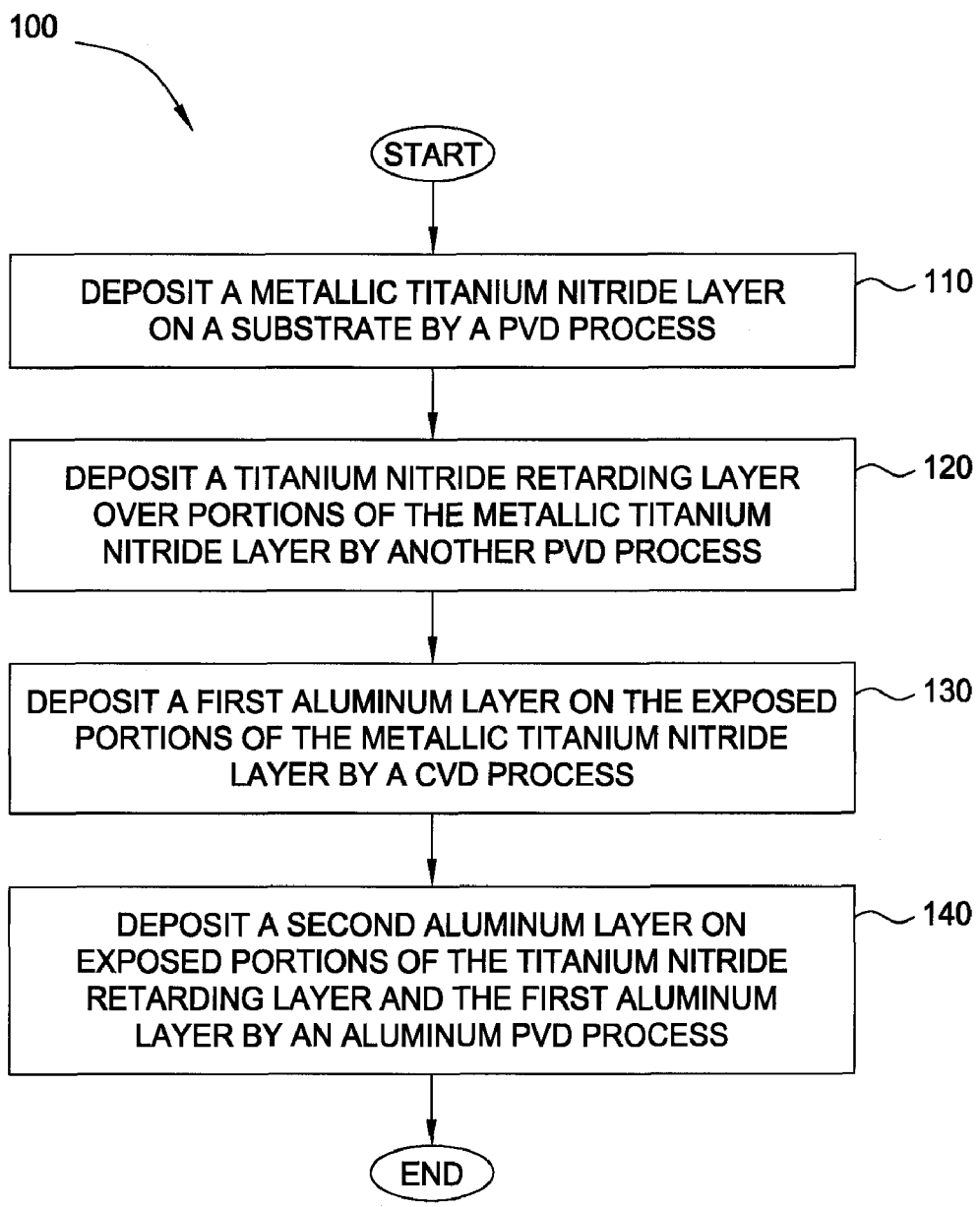
FIG. 1 depicts a flow chart illustrates a process for forming a conductive material, as described by embodiments herein.

In one embodiment, a method for forming a conductive material on a substrate is provided which includes positioning the substrate within a process chamber, such as a PVD chamber. The substrate may contain a dielectric material which has an upper surface and apertures formed therein. FIG. 1 depicts a flow chart illustrating process 100, as described in an embodiment herein. In step 110, a metallic titanium nitride layer may be deposited on the substrate during a PVD process conducted in a metallic mode. A titanium nitride retarding layer may be deposited over portions of the metallic titanium nitride layer by a PVD process conducted in a poison mode during step 120. In step 130, a first aluminum layer, such as an aluminum seed, may be deposited on exposed portions of the metallic titanium nitride layer during a CVD process. In step 140, a second aluminum layer, such as an aluminum bulk layer, may be deposited by an aluminum PVD process to fill the apertures while covering exposed portions of the titanium nitride retarding layer and the first aluminum layer.

In step 110, the titanium nitride retarding layer is deposited on the substrate during a PVD process conducted in a metallic mode. A plasma is usually generated with nitrogen gas having a flow rate of less than about 80 sccm during the metallic mode of the PVD process. In some examples, the flow rate of the nitrogen gas is less than about 70 sccm, and preferably, about 55 sccm or less. In one embodiment, the nitrogen gas may have a flow rate within a range from about 5 sccm to about 75 sccm, preferably, from about 10 sccm to about 55 sccm, and more preferably, from about 15 sccm to about 45 sccm during step 110. In one example, the flow rate of the nitrogen gas is within a range from about 15 sccm to about 25 sccm. In another example, the flow rate of the nitrogen gas is within a range from about 25 sccm to about 35 sccm.

During the PVD process of step 110, a RF bias may be applied to the substrate and a DC power may also be applied to a titanium target. The RF bias may have a power level within a range from about 50 W to about 1,200 W, preferably, from about 100 W to about 800 W while in metallic mode for depositing the metallic titanium nitride layer. Also in step 110, the DC power may be applied to the titanium target at a first power level within a range from about 20 kW to about 40 kW, preferably, from about 25 kW to about 35 kW. An ignition gas (e.g., argon) may be administered into the PVD chamber having a flow rate within a range from about 2 sccm to about 20 sccm, for example, about 8 sccm. The substrate may be heated to a temperature within a range from about 20° C. to about 500° C., preferably, from about 200° C. to about 300° C. during step 110.

In another embodiment, the metallic titanium nitride layer may contain a metallic titanium nitride material having the chemical formula of $Ti_xN_y$, where x is within a range from about 1.5 to about 2 and y is about 1. The metallic titanium nitride layer may be deposited to a thickness within a range from about 100 Å to about 1,000 Å, preferably, from about 200 Å to about 500 Å, and more preferably, from about 250 Å to about 400 Å, such as about 300 Å. In one example, a metallic titanium nitride layer having a thickness of about 300 Å is deposited by conducting a PVD process which lasts from about 20 seconds to about 25 seconds during step 110.

In step 120, a titanium nitride retarding layer is deposited on the metallic titanium nitride layer during the PVD process conducted in a poison mode. During this second PVD process, the plasma is usually generated with nitrogen gas having a flow rate of greater than about 80 sccm. In some examples, the flow rate of the nitrogen gas is greater than about 100 sccm, such as about 150 sccm, about 250 sccm, or greater.

During the PVD process of step 120, a RF bias is usually not applied to the substrate or substrate support, but the DC power is applied to the titanium target, although generally at a lower power than the DC power used in step 110. The DC power in step 120 may be applied to the titanium target at a second power level within a range from about 1 kW to about 30 kW, preferably, from about 5 kW to about 25 kW. An ignition gas (e.g., argon) may be administered into the PVD chamber having a flow rate within a range from about 2 sccm to about 20 sccm, for example, about 8 sccm. The substrate may be heated to a temperature within a range from about 20° C. to about 500° C., preferably, from about 200° C. to about 300° C. during step 120.

In another embodiment, the titanium nitride retarding layer may contain a titanium nitride retarding material having the chemical formula of $Ti_xN_y$, where x is about 1 and y is within a range from about 1 to about 1.2. The titanium nitride retarding layer may have a thickness within a range from about 2 Å to about 100 Å, preferably, from about 5 Å to about 70 Å, and more preferably, from about 10 Å to about 50 Å, such as about 30 Å. In one example, a titanium nitride retarding layer having a thickness of about 30 Å is deposited by conducting a PVD process for about 1 second during step 120.

The substrate support and substrate are usually RF biased during the PVD process conducted in metallic mode of step 110 in order to help direct the titanium material (e.g., metallic titanium nitride material) into the apertures or vias on the substrate. However, the substrate support and substrate are usually not RF biased during the PVD process conducted in poison mode of step 120. The titanium material (e.g., titanium nitride retarding material) scatters due to being unbiased, thereby inhibiting or minimizing the titanium material from entering the apertures or vias while depositing across the substrate field.

In one embodiment, the PVD process in step 110 and the PVD process in step 120 are performed in different process chambers. However, in another embodiment, the PVD processes in steps 110 and 120 are preferably performed in the same process chamber. If steps 110 and 120 are performed in the same PVD chamber, then the RF bias may be removed from the substrate, the DC power may be reduced, and the nitrogen flow rate may be increased during the second PVD process in step 120.

In one example, steps 110 and 120 are performed in the same PVD process chamber, such as a SIP-TTN chamber or a FALCON-TTN chamber, both commercially available from Applied Materials, Inc., located in Santa Clara, Calif. In another example, steps 110 and 120 are performed in different PVD process chambers, such as a SIP-TiN chamber for depositing the metallic titanium nitride layer of step 110 and a DS-TiN chamber for depositing the titanium nitride retarding layer of step 120. Alternately, step 110 may be performed in a FALCON-TiN chamber and step 120 may be performed in a DS-TiN chamber, also available from Applied Materials, Inc.

Figure 2A:
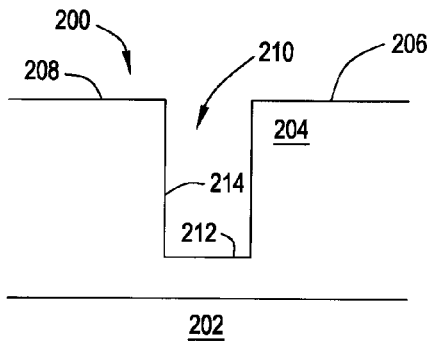
FIGS. 2A-2F depict a cross sectional view of a substrate at various processing steps, as described by embodiments herein.

In one embodiment, process 100 may be used to deposit various material layers on substrate 200, depicted in FIGS. 2A-2F. Process 100 contains multiple steps that may be used to deposit two titanium-containing layers (steps 110 and 120) and two aluminum containing layers (steps 130 and 140). FIG. 2A depicts substrate 200 containing dielectric layer 204 disposed on lower layer 202. Field 208 of substrate 200 extends across upper surface 206 of dielectric layer 204. A via or aperture 210 may be formed within dielectric layer 204 by etching techniques or dielectric layer 204 may be deposited forming aperture 210. Aperture 210 extends through dielectric layer 204 and contains bottom surface 212 and wall surfaces 214. In an alternative example, aperture 210 may extended through dielectric layer 204 to lower layer 202, wherein bottom surface 212 would be the upper surface of lower layer 202 (not shown). Aperture 210 may have an aspect ratio of 3:1 or greater, preferably, about 5:1, about 10:1, about 20:1, or greater. In some examples, vias or apertures 210 have a width of about 0.12 µm and an aspect ratio of about 4:1 or greater.

Lower layer 202 may be a contact or electrode layer and contain a conductive material such as copper, aluminum, tungsten, or alloys thereof. Lower layer 202 may also be the actual substrate surface, a dielectric layer, a barrier layer, or other layer disposed on substrate 200. Dielectric layer 204 may contain a dielectric material such as a silicon-containing materials, silicon-germanium, silicon oxide, hafnium oxide, hafnium silicate, hafnium silicon oxynitride, aluminates thereof, doped variants thereof, derivatives thereof, or combinations thereof.

Figure 2D:
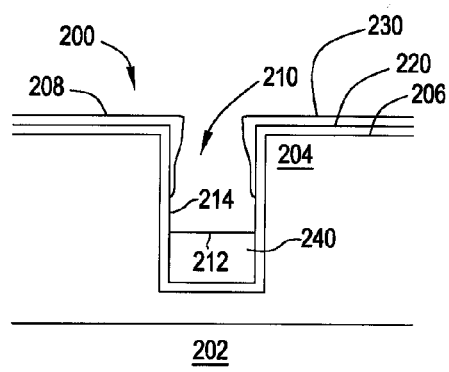
Figure 2B:
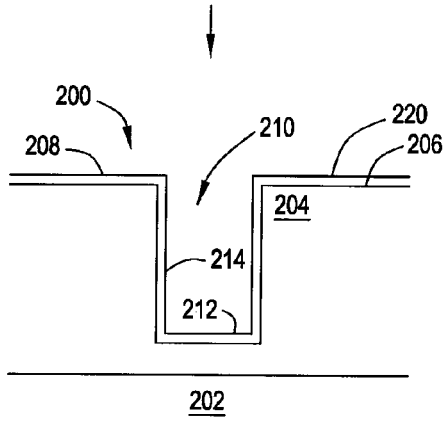

FIG. 2B depicts metallic titanium nitride layer 220 deposited on substrate 200, and more specifically on upper surface 206 of dielectric layer 204 and within aperture 210. Metallic titanium nitride layer 220 is deposited on both bottom surface 212 and sidewalls of aperture 210. The portion of metallic titanium nitride layer 220 that is deposited on upper surface 206 forms field 208 of substrate 200. In one embodiment, metallic titanium nitride layer 220 contains a metallic titanium nitride material that may be deposited by a PVD process, such as in step 110.

In one embodiment, the PVD process may be performed in a metallic mode and therefore the metallic titanium nitride material is formed titanium rich, that is, Ti:N atomic ratio is greater than 1. The metallic titanium nitride material of metallic titanium nitride layer 220 may be deposited with the chemical formula of $Ti_xN_y$, where x is greater than 1 and y is about 1. In one example, the metallic titanium nitride material has the chemical formula of $Ti_xN_y$, where x within a range from about 1.2 to about 2 and y is about 1. In another example, the metallic titanium nitride material has the chemical formula of $Ti_xN_y$, where x within a range from about 1.4 to about 2 and y is about 1. In another example, the metallic titanium nitride material has the chemical formula of $Ti_xN_y$, where x within a range from about 1.5 to about 2 and y is about 1. Examples of the titanium nitride material contained in metallic titanium nitride layer 220 include $Ti_{1.5}N$, $Ti_{1.55}N$, $Ti_{1.6}N$, $Ti_{1.65}N$, $Ti_{1.7}N$, $Ti_{1.75}N$, $Ti_{1.8}N$, $Ti_{1.85}N$, $Ti_{1.9}N$, $Ti_{1.95}N$, $Ti_2N$, derivatives thereof, or combinations thereof. Metallic titanium nitride layer 220 may have a thickness within a range from about 100 Å to about 1,000 Å, preferably, from about 200 Å to about 500 Å, for example, about 300 Å.

Figure 2E:
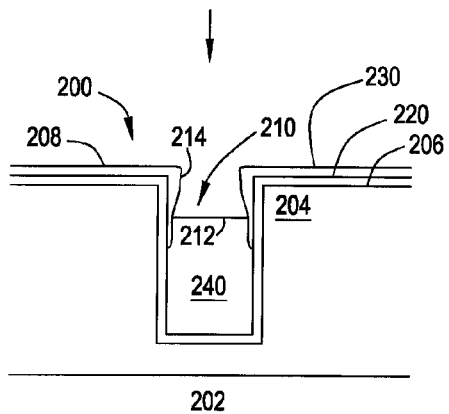
Figure 2C:
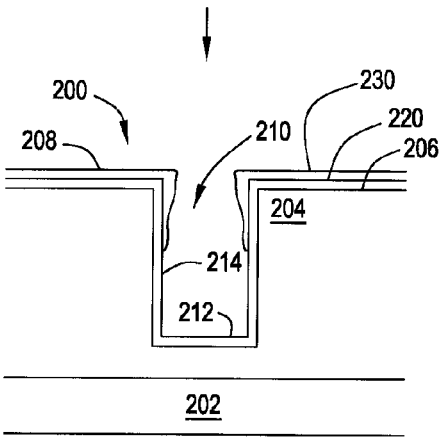

FIG. 2C depicts titanium nitride retarding layer 230 deposited on metallic titanium nitride layer 220, at least across field 208 of substrate 200. In one embodiment, titanium nitride retarding layer 230 is deposited on the portion of metallic titanium nitride layer 220 which is disposed on upper surface 206 and deposited on at least a portion of sidewalls 214 of aperture 210, as depicted in FIGS. 2C-2F. However, in another embodiment, titanium nitride retarding layer 230 is deposited on the portion of metallic titanium nitride layer 220 which is disposed on upper surface 206 and deposited on at least a portion of sidewalls 214 and bottom surface 212 of aperture 210 (not shown). In another embodiment, titanium nitride retarding layer 230 is selectively deposited only on the portion of metallic titanium nitride layer 220 which is disposed on upper surface 206 (not shown).

In one embodiment, titanium nitride retarding layer 230 contains a titanium nitride retarding material that may be deposited by a PVD process, as described in step 120 of process 100. The PVD process may be conducted in a poison mode and therefore the titanium nitride retarding material is nitrogen rich, that is, the Ti:N atomic ratio is about 1 or less than 1. The titanium nitride retarding material of titanium nitride retarding layer 230 may be deposited with the chemical formula of $Ti_xN_y$, where x is about 1 and y is about 1 or greater than 1. In one example, the titanium nitride retarding material has the chemical formula of $Ti_xN_y$, where x is about 1 and y is about 1. In another example, the titanium nitride retarding material has the chemical formula of $Ti_xN_y$, where x is about 1 and y is within a range from about 1 to about 1.1. In another example, the titanium nitride retarding material has the chemical formula of $Ti_xN_y$, where x is about 1 and y is within a range from about 1 to about 1.2. Examples of the titanium nitride retarding material contained in titanium nitride retarding layer 230 include TiN, $TiN_{1.05}$, $TiN_{1.10}$, $TiN_{1.15}$ $TiN_{1.20}$, derivatives thereof, and combinations thereof. Titanium nitride retarding layer 230 may have a thickness within a range from about 2 Å to about 100 Å, preferably, from about 10 Å to about 50 Å, for example, about 30 Å.

In one embodiment, titanium nitride retarding layer 230 may be absent from aperture 210. Alternatively, titanium nitride retarding layer 230 is a discontinuous layer extending across bottom surface 212 and sidewalls 214 of aperture 210. For embodiments when titanium nitride retarding layer 230 is deposited on metallic titanium nitride layer 220 within aperture 210, portions of titanium nitride retarding layer 230 may be deposited on bottom surface 212 and sidewalls 214 at about 10% or less of the thickness as the portion of titanium nitride retarding layer 230 deposited across field 208 of substrate 200. In one example, the average thickness of titanium nitride retarding layer 230 deposited on bottom surface 212 and sidewalls 214 is about 10% or less of the average thickness of titanium nitride retarding layer 230 deposited across field 208. In other examples, the average thickness of titanium nitride retarding layer 230 deposited on bottom surface 212 and sidewalls 214 is about 5%, about 2%, about 1%, or less of the average thickness of titanium nitride retarding layer 230 deposited across field 208.

In one embodiment, FIGS. 2D-2E depict aluminum layer 240 deposited into aperture 210 during a bottom-up CVD or MOCVD process, as shown in step 130 of process 100. Aluminum layer 240 is selectively deposited on metallic titanium nitride layer 220, as opposed to titanium nitride retarding layer 230. Titanium nitride retarding layer 230 still forms field 208 due to the lack of formation of aluminum layer 240 on titanium nitride retarding layer 230. In FIG. 2D, aluminum layer 240 is shown deposited on bottom surface 212 and sidewalls 214 that contain metallic titanium nitride layer 220. The aluminum material of aluminum layer 240 selectively formed on metallic titanium nitride layer 220 and not on titanium nitride retarding layer 230 during the CVD process. As aperture 210 is filled by aluminum layer 240, aluminum material continues to be deposited from bottom surface 212 of aluminum layer 240, thereby depositing over any titanium nitride retarding layer 230 that may be within aperture 210, as depicted by FIG. 2E.

During step 130, the substrate may be exposed to an aluminum precursor during the CVD process while depositing the aluminum layer. The aluminum precursor may include alane compounds, aluminum borohydride compounds, alkyl aluminum compounds, alkyl aluminum hydride compounds, complexes thereof, or derivates thereof. In some examples, aluminum layer 240 is deposited from aluminum precursor, such as methylpyrrolidine:alane, aluminum borohydride trimethylamine, dimethyl aluminum hydride, complexes thereof, derivates thereof, and combinations thereof.

An important characteristic of the aluminum precursor is to have a favorable vapor pressure. An aluminum precursor may have the state of a gas, liquid, or solid at ambient temperature and pressure. However, within the process chamber during a CVD process, the aluminum precursor volatilized into the gas state. Precursors may be heated prior to delivering into the process chamber. An aluminum precursor gas may be formed by heating the aluminum precursor within a vaporizer, a bubbler, or an ampoule to a temperature of at least about 25° C., preferably, to a temperature within a range from about 25° C. to about 50° C., such as about 40° C. A carrier gas (e.g., Ar) is flown across or bubbled through the heated aluminum precursor to form the aluminum precursor gas. The carrier gas may contain argon, nitrogen, hydrogen, helium, or combinations thereof. The carrier gas may have a flow rate within a range from about 50 sccm to about 2,000 sccm, preferably, from about 100 sccm to about 1,000 sccm.

In one embodiment, the substrate may be heated to a temperature within a range from about 25° C. to about 400° C., preferably, from about 50° C. to about 200° C. during the CVD process while depositing the aluminum layer onto the metallic titanium nitride layer. The aluminum layer may be deposited to a thickness within a range from about 100 Å to about 1,000 Å, preferably, from about 200 Å to about 800 Å, and more preferably, from about 400 Å to about 600 Å, such as about 500 Å. In one example, an aluminum layer having a thickness of about 500 Å is deposited in about 50 seconds by an MOCVD process during step 130. In some embodiments, aluminum layer 240 may be a continuous layer across metallic titanium nitride layer 220. Alternatively, aluminum layer 240 may be a discontinuous layer across metallic titanium nitride layer 220, such as a seed layer or a nucleation layer.

In one embodiment, aluminum layer 240 is an aluminum seed layer deposited into aperture 210 in step 130, and subsequently, aluminum layer 250, an aluminum bulk layer, is deposited to fill aperture 210. In an alternative embodiment, aluminum layer 240 is deposited to fill aperture 210 and step 140 is omitted during process 100.

Figure 2F:
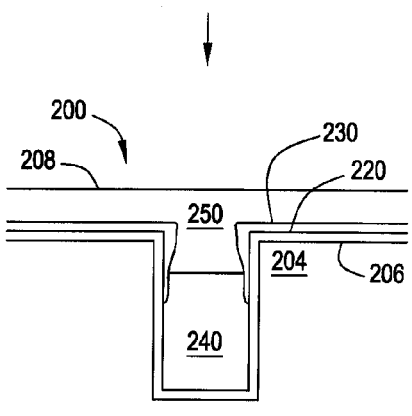

FIG. 2F depicts aluminum layer 250 deposited on substrate 200 after step 140 of process 100, as described by an embodiment herein. Field 208 of substrate 200 is formed by aluminum layer 250. Aluminum layer 250 may be an aluminum bulk layer deposited on exposed portions of aluminum layer 240 and titanium nitride retarding layer 230 during an aluminum PVD process. During the PVD process of step 140, a RF bias may optionally be applied to the substrate support and the substrate. In one example, there is not a RF bias across the substrate support or the substrate. In another example, the RF bias is applied and may have a power level of up to about 500 W while depositing aluminum layer 250. Also in step 140, a DC power may be applied to the aluminum target at a power level within a range from about 0.5 kW to about 30 kW, preferably, from about 5 kW to about 25 kW, such as about 15 kW during the aluminum PVD process. An ignition gas (e.g., argon) may be administered into the PVD chamber having a flow rate within a range from about 10 sccm to about 200 sccm, preferably, from about 25 sccm to about 100 sccm, for example, about 70 sccm.

The substrate may be heated to a temperature within a range from about 200° C. to about 600° C., preferably, from about 350° C. to about 450° C. during the aluminum PVD process. The aluminum layer deposited during step 140 may have a thickness of greater than about 1,000 Å, preferably, greater than about 3,000 Å, and more preferably, greater than about 4,000 Å, such as within a range from about 5,000 Å to about 6,000 Å, or greater. The aluminum layer is usually deposited by the PVD process at a rate within a range from about 100 Å/second to about 200 Å/second.

Platforms

Figure 3:
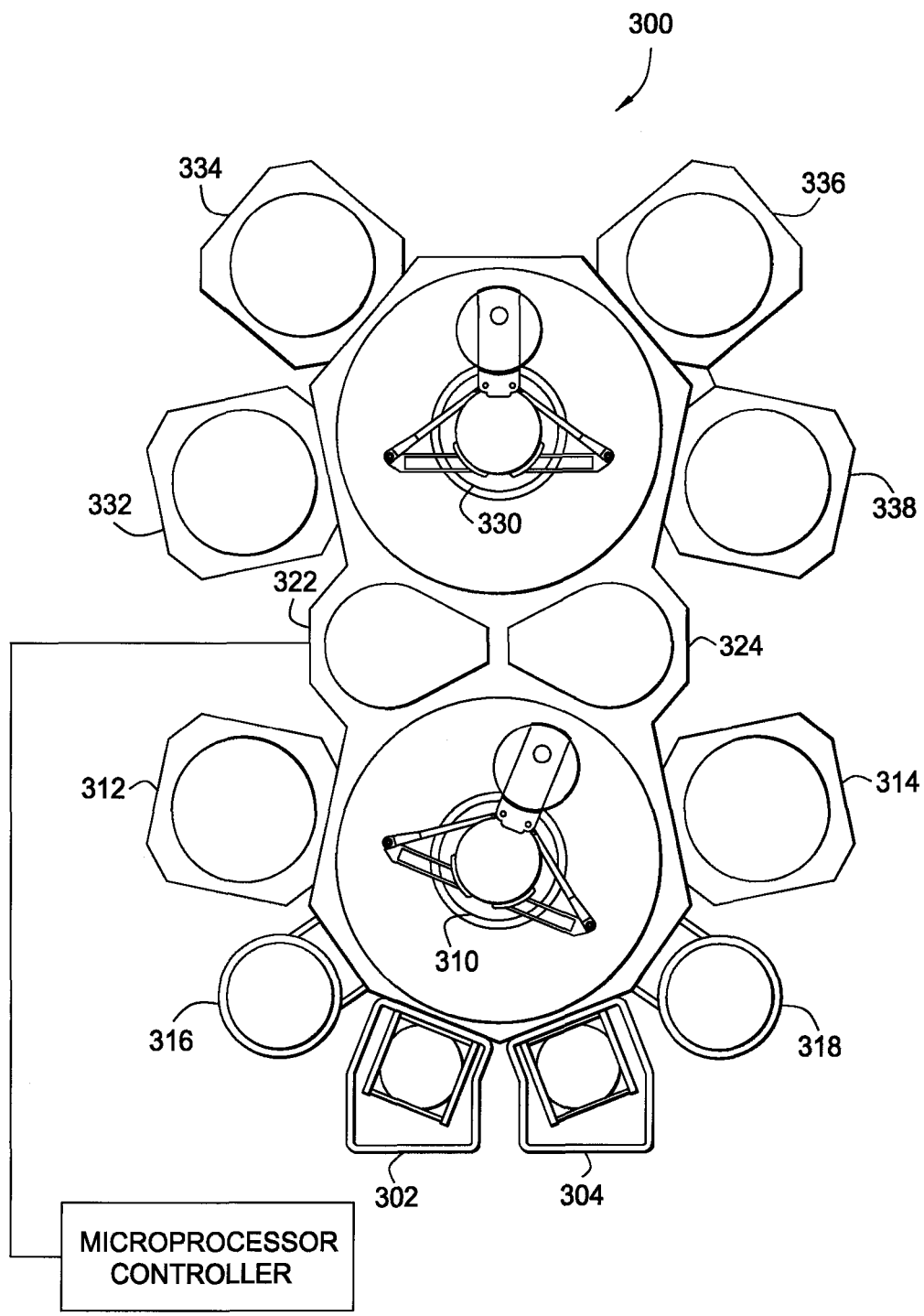
FIG. 3 depicts a processing system that may be utilized to perform processes described by embodiments herein.

FIG. 3 is a schematic top-view diagram of processing system 300. A similar multichamber processing system is disclosed in commonly assigned U.S. Pat. No. 5,186,718, which is herein incorporated by reference. For example, a platform system, such as processing system 300, is commercially available as the ENDURA® iFill Al CVD/PVD system from Applied Materials, Inc., located in Santa Clara, Calif. Processing system 300 generally includes load lock chambers 302 and 304 for the transfer of substrates into and out of processing system 300. Load lock chambers 302 and 304 may be used to place the substrates introduced into processing system 300 under a vacuum environment. Robot 310 may be used to transfer the substrates between load lock chambers 302 and 304, and one or more substrate process chambers 312, 314, 316, and 318 (four are shown). Each process chambers 312, 314, 316, and 318, may be outfitted to perform a number of substrate processing operations such as ALD, CVD, PVD, etch, preclean, degas, orientation, and other processes. Robot 310 also transfers substrates to and from one or more transfer chambers 322 and 324.

Transfer chambers 322 and 324 are used to maintain ultra-high vacuum conditions while allowing substrates to be transferred within processing system 300. Robot 330 may transfer the substrates between transfer chambers 322 and 324 and one or more process chambers 332, 334, 336, and 338. Similar to process chambers 312, 314, 316, and 318, process chambers 332, 334, 336, and 338 can be outfitted to perform a variety of substrate processing operations, such as ALD, CVD, PVD, etch, preclean, degas, and orientation, for example. Any of process chambers 312, 314, 316, 318, 332, 334, 336, and 338 may be removed from processing system 300.

In one embodiment, process chambers 316 and 318 may each be an anneal chamber while process chambers 312 and 314 may each be a plasma clean chamber or a vapor deposition chamber, such as an ALD chamber, a CVD chamber, or a PVD chamber adapted to deposit a barrier layer. In one example, process chambers 312 and 314 may each be a plasma preclean chamber. In another example, process chambers 312 and 314 may each be a PVD chamber configured to deposit a titanium nitride barrier layer, such as a metallic titanium nitride layer or a titanium nitride retarding layer.

In another embodiment, process chamber 332 and 338 may each be a PVD chamber adapted to deposit titanium nitride layers and process chambers 334 and 336 may each be an ALD chamber, a CVD chamber, or a PVD chamber adapted to deposit aluminum layers. In another embodiment, process chambers 332 and 334 may each be a PVD chamber adapted to deposit titanium nitride layers and process chambers 336 and 338 may each be an ALD chamber, a CVD chamber, or a PVD chamber adapted to deposit aluminum layers.

In one embodiment, steps 110 and 120 of process 100 may be performed in the same PVD process chamber, which may be a SIP-TTN chamber or a FALCON-TTN chamber, commercially available from Applied Materials, Inc., located in Santa Clara, Calif. In one example, any of process chambers 332, 334, 336, or 338 may be a SIP-TTN chamber or a FALCON-TTN chamber for depositing a titanium nitride barrier material by a PVD process. In another embodiment, steps 110 and 120 of process 100 may be performed in different PVD process chambers, which may be a SIP-TiN chamber and a DS-TiN chamber, or a FALCON-TiN chamber and a DS-TiN chamber, also available from Applied Materials, Inc. In one example, process chamber 332 may be a SIP-TiN chamber or a FALCON-TiN chamber used to deposit a metallic titanium nitride layer during a PVD process and any of process chambers 334, 336, or 338 may be a DS-TiN chamber used to deposit a titanium nitride retarding layer during another PVD process.

In another embodiment, the deposition of the aluminum layer by a CVD process during step 130 of process 100 may be performed in a CVD process chamber, such as the ENDURA® Al CVD chamber, available from Applied Materials, Inc., located in Santa Clara, Calif. Further, the deposition of the aluminum layer by a PVD process during step 140 of process 100 may be performed in a PVD process chamber, such as the ENDURA® Al HP PVD chamber, also available from Applied Materials, Inc. In one example, any of process chambers 332, 334, 336, or 338 may be used to deposit an aluminum layer by a CVD process or a PVD process.

In another embodiment, a process chamber that may be used to deposit the aluminum material is the ALD/CVD hybrid chamber, such as disclosed in commonly assigned U.S. Pat. No. 7,204,886, which is herein incorporated by reference. Another process chamber that may be used to deposit the aluminum material may be configured to operate in both an ALD mode as well as a conventional CVD mode, as described in commonly assigned U.S. Pat. No. 6,878,206, which is incorporated herein by reference.

In one exemplary configuration, processing system 300 contains load lock chambers 302 and 304, process chambers 316 and 318 as plasma preclean chambers or anneal chambers, process chambers 312 and 314 as anneal chambers or vapor deposition chambers, process chamber 332 as a PVD chamber configured to deposit a metallic titanium nitride barrier layer, process chamber 334 as a PVD chamber configured to deposit a titanium nitride retarding layer, process chamber 336 as a CVD chamber or a MOCVD chamber configured to deposit a first aluminum layer or an aluminum seed layer, and process chamber 338 as a PVD chamber configured to deposit a second aluminum layer or an aluminum bulk layer.

In another exemplary configuration, processing system 300 contains load lock chambers 302 and 304, process chambers 316 and 318 as plasma preclean chambers or anneal chambers, process chambers 312 and 314 as PVD chambers each configured to deposit a metallic titanium nitride barrier layer and a titanium nitride retarding layer, process chambers 332 and 338 as CVD or MOCVD chambers configured to deposit a first aluminum layer or an aluminum seed layer, and process chambers 334 and 336 as PVD chambers each configured to deposit a second aluminum layer or an aluminum bulk layer.

Figure 4:
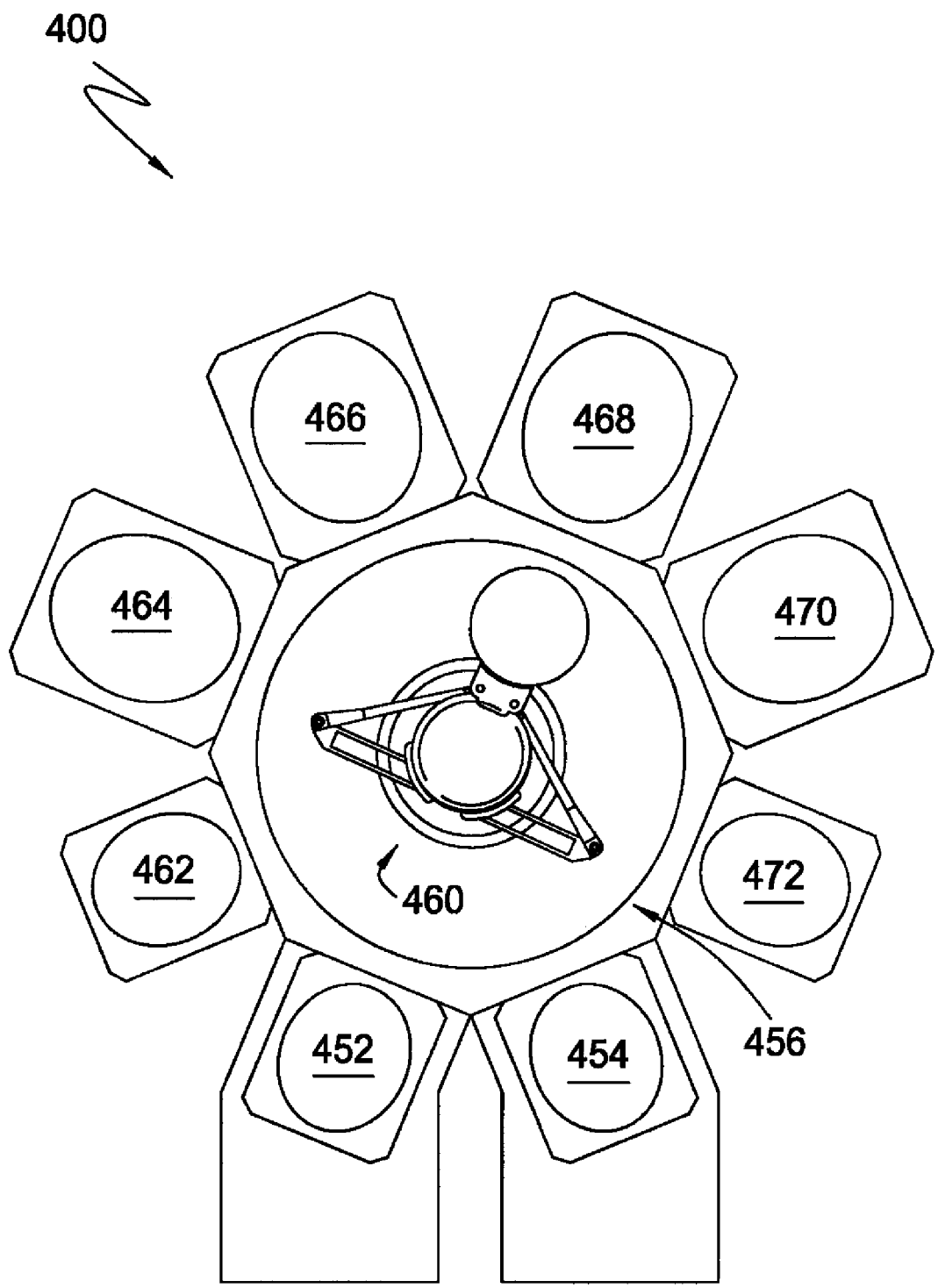
FIG. 4 depicts another processing system that may be utilized to perform processes described by embodiments herein.

FIG. 4 is a schematic top-view diagram of processing system 400. Processing system 400 generally includes load lock chambers 452 and 454 for the transfer of substrates into and out from processing system 400. Typically, since processing system 400 is under vacuum, load lock chambers 452 and 454 may "pump down" the substrates introduced into processing system 400. Robot 460 may transfer the substrates between load lock chambers 452 and 454, and process chambers 462, 464, 466, 468, 470, and 472. Process chambers 462, 464, 466, 468, 470, and 472 may each be outfitted to perform a number of substrate processing operations such as ALD, CVD, PVD, etch, preclean, degas, heat, orientation, and other substrate processes. Robot 460 also transfers substrates to and from transfer chamber 456. Any of process chambers 462, 464, 466, 468, 470, and 472 may be removed from processing system 400 when not in use by processing system 400.

In one embodiment, process chambers 462 and 472 may be plasma preclean chambers, process chambers 464 and 466 may be PVD chambers configured to deposit titanium nitride layers, and process chambers 468 and 470 may be configured to deposit aluminum layers by CVD or PVD. In one example, steps 110 and 120 of process 100 may be performed in different PVD process chambers, which may be a SIP-TiN chamber and a DS-TiN chamber, or a FALCON-TiN chamber and a DS-TiN chamber, also available from Applied Materials, Inc. For example, process chamber 464 may be a SIP-TiN chamber or a FALCON-TiN chamber used to deposit a metallic titanium nitride layer during a PVD process and any of process chambers 466, 468, or 470 may be a DS-TiN chamber used to deposit a titanium nitride retarding layer during another PVD process.

In one exemplary configuration, processing system 400 contains load lock chambers 452 and 454, process chambers 462 and 472 as plasma preclean chambers or anneal chambers, process chamber 464 as a PVD chamber configured to deposit a metallic titanium nitride layer, process chamber 466 as a PVD chamber configured to deposit a titanium nitride retarding layer, process chamber 468 as a CVD chamber or a MOCVD chamber configured to deposit a first aluminum layer or an aluminum seed layer, and process chamber 470 as a PVD chamber configured to deposit a second aluminum layer or an aluminum bulk layer.

While the foregoing is directed to embodiments of the invention, other and further embodiments of the invention may be devised without departing from the basic scope thereof, and the scope thereof is determined by the claims that follow.

The invention claimed is:

1. A method for forming a conductive material on a substrate, comprising:
positioning a substrate within a process chamber, wherein the substrate comprises a dielectric material disposed thereon, the dielectric material comprises an upper surface and apertures formed therein, and each aperture comprises a lower surface and sidewalls;
depositing a metallic titanium nitride layer on the upper surface of the dielectric material and on the lower surfaces and the sidewalls of the apertures during a first PVD process, wherein the first PVD process comprises generating a first plasma and flowing nitrogen gas at a flow rate of less than about 80 sccm during; and
depositing a titanium nitride retarding layer on the metallic titanium nitride layer during a second PVD process, wherein the second PVD process comprises generating a second plasma and flowing the nitrogen gas at a flow rate of about 80 sccm or greater, and depositing the titanium nitride retarding layer on the lower surfaces and sidewalls of the apertures at about 10% or less of the thickness as the titanium nitride retarding layer deposited across the upper surface of the substrate.

2. The method of claim 1, wherein the first PVD process and the second PVD process are performed in separate process chambers.

3. The method of claim 1, wherein the first PVD process and the second PVD process are performed in the same process chamber.

4. The method of claim 2, wherein a RF bias is applied to the substrate during the first PVD process and the RF bias is removed from the substrate during the second PVD process.

5. The method of claim 4, wherein the RF bias is at a power level within a range from about 100 W to about 800 W during the first PVD process.

6. The method of claim 4, wherein a DC power is applied to a titanium target at a first power level within a range from about 20 kW to about 40 kW during the first PVD process and at a second power level within a range from about 5 kW to about 25 kW during the second PVD process.

7. The method of claim 1, wherein the flow rate of the nitrogen gas is about 55 sccm or less during the first PVD process.

8. The method of claim 1, wherein the metallic titanium nitride layer comprises metallic titanium nitride material having the chemical formula of $Ti_xN_y$, where x is within a range from about 1.5 to about 2 and y is about 1.

9. The method of claim 8, wherein the titanium nitride retarding layer comprises a titanium nitride retarding material having the chemical formula of $Ti_xN_y$, where x is about 1 and y is within a range from about 1 to about 1.2.

10. The method of claim 1, further comprising depositing a first aluminum layer selectively on exposed portions of the metallic titanium nitride layer while maintaining the titanium nitride retarding layer substantially free of the first aluminum layer during a CVD process.

11. The method of claim 10, further comprising depositing a second aluminum layer on the titanium nitride retarding layer and on the exposed portions of the first aluminum layer during another PVD process.

12. The method of claim 1, wherein the metallic titanium nitride layer has a thickness within a range from about 100 Å to about 1,000 Å.

13. The method of claim 12, wherein the thickness is within a range from about 200 Å to about 500 Å.

14. The method of claim 1, wherein the titanium nitride retarding layer has a thickness within a range from about 2 Å to about 100 Å.

15. The method of claim 14, wherein the thickness is within a range from about 10 Å to about 50 Å.

16. A method for forming a conductive material on a substrate, comprising:
positioning a substrate within a process chamber, wherein the substrate comprises a dielectric material disposed thereon, the dielectric material comprises an upper surface and apertures formed therein, and each aperture comprises a lower surface and sidewalls;
depositing a metallic titanium nitride layer on the upper surface of the dielectric material and on the lower surfaces and the sidewalls of the apertures during a first PVD process, wherein the metallic titanium nitride layer comprises a metallic titanium nitride material having the chemical formula of $Ti_xN_y$, where x is within a range from about 1.5 to about 2 and y is about 1; and
depositing a titanium nitride retarding layer on the metallic titanium nitride layer deposited on the upper surface of the dielectric material during a second PVD process, wherein the titanium nitride retarding layer comprises a titanium nitride retarding material having the chemical formula of $Ti_xN_y$, where x is about 1 and y is within a range from about 1 to about 1.2.

17. The method of claim 16, wherein the titanium nitride retarding layer deposited on the lower surfaces and sidewalls of the apertures is about 10% or less of the thickness as the titanium nitride retarding layer deposited across the upper surface of the substrate.

18. The method of claim 16, wherein a RF bias is applied to the substrate during the first PVD process and the RF bias is removed from the substrate during the second PVD process.

19. The method of claim 18, wherein the RF bias is at a power level within a range from about 100 W to about 800 W during the first PVD process.

20. The method of claim 18, wherein a DC power is applied to a titanium target at a first power level within a range from about 20 kW to about 40 kW during the first PVD process and at a second power level within a range from about 5 kW to about 25 kW during the second PVD process.

21. The method of claim 16, wherein the first PVD process and the second PVD process are performed in the same process chamber.

22. The method of claim 16, wherein the first PVD process and the second PVD process are performed in separate process chambers.

23. A method for forming a conductive material on a substrate, comprising:
  positioning a substrate within a PVD chamber, wherein the substrate comprises a dielectric material disposed thereon, the dielectric material comprises an upper surface and apertures formed therein, and each aperture comprises a lower surface and sidewalls;
  depositing a metallic titanium nitride layer on the upper surface of the dielectric material and on the lower surfaces and the sidewalls of the apertures during a first PVD process within the PVD chamber, the first PVD process comprises:
    flowing nitrogen gas into the PVD chamber at a flow rate of less than about 80 sccm;
    applying a RF bias to the substrate; and
    applying a first DC power to a titanium target at a power level within a range from about 20 kW to about 40 kW to ignite a first plasma; and
  depositing a titanium nitride retarding layer on the metallic titanium nitride layer deposited on the upper surface of the dielectric material during a second PVD process within the PVD chamber, the second PVD process comprises:
    flowing the nitrogen gas into the PVD chamber at a flow rate of about 80 sccm or greater;
    removing the RF bias from the substrate; and
    applying a second first DC power to the titanium target at a power level within a range from about 5 kW to about 25 kW to ignite a second plasma.

24. The method of claim 23, wherein the flow rate of the nitrogen gas is about 55 sccm or less during the first PVD process.

25. The method of claim 23, wherein the metallic titanium nitride layer comprises metallic titanium nitride material having the chemical formula of $Ti_xN_y$, where x is within a range from about 1.5 to about 2 and y is about 1.

26. The method of claim 25, wherein the titanium nitride retarding layer comprises titanium nitride retarding material having the chemical formula of $Ti_xN_y$, where x is about 1 and y is within a range from about 1 to about 1.2.

27. A method for forming a conductive material on a substrate, comprising:
  positioning a substrate within a process chamber, wherein the substrate comprises a dielectric material disposed thereon, the dielectric material comprises an upper surface and apertures formed therein, and each aperture comprises a lower surface and sidewalls;
  depositing a metallic titanium nitride layer on the upper surface of the dielectric material and on the lower surfaces and the sidewalls of the apertures during a first PVD process;
  depositing a titanium nitride retarding layer on the metallic titanium nitride layer deposited over the upper surface of the dielectric material while maintaining the lower surface of the apertures substantially free of the titanium nitride retarding layer during a second PVD process;
  depositing a first aluminum layer selectively on exposed portions of the metallic titanium nitride layer while maintaining the titanium nitride retarding layer free of the first aluminum layer during a CVD process; and
  depositing a second aluminum layer on the titanium nitride retarding layer and on the exposed portions of the first aluminum layer during another PVD process.

28. The method of claim 27, wherein a first plasma is generated with nitrogen gas having a flow rate of less than about 80 sccm during the first PVD process, and a second plasma is generated with the nitrogen gas having a flow rate of greater than about 80 sccm during the second PVD process.

29. The method of claim 28, wherein the flow rate of the nitrogen gas is about 55 sccm or less during the first PVD process.

30. The method of claim 28, wherein a DC power is applied to a titanium target at a first power level within a range from about 20 kW to about 40 kW during the first PVD process and at a second power level within a range from about 5 kW to about 25 kW during the second PVD process.

31. The method of claim 27, wherein the first aluminum layer has a thickness within a range from about 300 Å to about 600 Å.

32. The method of claim 31, wherein the first aluminum layer and the second aluminum layer have a combined thickness within a range from about 1,000 Å to about 10,000 Å.

33. The method of claim 27 wherein the substrate is heated to a temperature within a range from about 50° C. to about 250° C. during the CVD process to deposit the first aluminum layer.

34. The method of claim 27, wherein the substrate is exposed to an aluminum precursor during the CVD process to deposit the first aluminum layer, the aluminum precursor is selected from the group consisting of alane compounds, aluminum borohydride compounds, alkyl aluminum compounds, alkyl aluminum hydride compounds, complexes thereof, derivates thereof, and combinations thereof.

35. The method of claim 34, wherein the aluminum precursor is selected from the group consisting of methylpyrrolidine:alane, aluminum borohydride trimethylamine, dimethyl aluminum hydride, complexes thereof, derivates thereof, and combinations thereof.

36. A method for forming a conductive material on a substrate, comprising:
  positioning a substrate within a PVD chamber, wherein the substrate comprises a dielectric material disposed thereon, the dielectric material comprises an upper surface and apertures formed therein, and each aperture comprises a lower surface and sidewalls;
  depositing a metallic titanium nitride layer on the upper surface of the dielectric material and on the lower surfaces and the sidewalls of the apertures during a PVD process, wherein the metallic titanium nitride material has the chemical formula of $Ti_xN_y$, where x is within a range from about 1.5 to about 2 and y is about 1, and the PVD process comprises:
  flowing nitrogen gas into the PVD chamber at a flow rate of about 55 sccm or less;
  applying a RF bias to the substrate; and
  applying a first DC power to a titanium target at a power level within a range from about 25 kW to about 35 kW to ignite a plasma;
depositing a titanium nitride retarding layer on the metallic titanium nitride layer deposited over the upper surface of the dielectric material while maintaining the lower surface of the apertures substantially free of the titanium nitride retarding layer during a second PVD process;
transferring the substrate into a CVD chamber; and
depositing an aluminum layer on the metallic titanium nitride layer during a CVD process.

37. The method of claim 36, further comprising maintaining the titanium nitride retarding layer substantially free of the aluminum layer while selectively depositing the aluminum layer on exposed portions of the metallic titanium nitride layer during the CVD process.

38. The method of claim 36, wherein the second PVD process comprises:
  flowing the nitrogen gas into the PVD chamber at a flow rate of about 80 sccm or greater;
  removing the RF bias from the substrate; and
  applying a second DC power to the titanium target at a power level within a range from about 5 kW to about 25 kW to ignite a second plasma.

* * * * *